(12) United States Patent
Pei et al.

(10) Patent No.: US 9,330,624 B1
(45) Date of Patent: May 3, 2016

(54) VCOM AMPLIFIER WITH FAST-SWITCHING GAIN

(75) Inventors: Cheng-Wei Pei, Belmont, CA (US); Ronald Bonshaw Koo, Los Altos, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 171 days.

(21) Appl. No.: 13/405,090

(22) Filed: Feb. 24, 2012

Related U.S. Application Data

(63) Continuation-in-part of application No. 13/401,591, filed on Feb. 21, 2012.

(60) Provisional application No. 61/446,662, filed on Feb. 25, 2011.

(51) Int. Cl.
*G06F 3/038* (2013.01)
*G09G 5/00* (2006.01)
(Continued)

(52) U.S. Cl.
CPC ............ *G09G 3/3655* (2013.01); *G02F 1/1362* (2013.01); *G02F 1/134363* (2013.01); (Continued)

(58) Field of Classification Search
CPC ..... G06F 3/044; G06F 3/0418; G09G 3/3688; G09G 2310/0291; H04N 5/57; G02B 2027/0156; G02B 27/017
See application file for complete search history.

(56) References Cited

U.S. PATENT DOCUMENTS

| 5,481,273 A | 1/1996 | Shigeta et al. |
| 6,552,606 B1 * | 4/2003 | Veltman et al. ................. 330/10 |

(Continued)

OTHER PUBLICATIONS

Office Action dated Dec. 19, 2013, in related U.S. Appl. No. 13/401,591, filed Feb. 21, 2012.
(Continued)

*Primary Examiner* — Alexander Eisen
*Assistant Examiner* — Nan-Ying Yang
(74) *Attorney, Agent, or Firm* — North Weber & Baugh LLP

(57) ABSTRACT

Electronic devices with a $V_{COM}$ display panel are configured to provide a common voltage $V_{COM}$ to a $V_{COM}$ display panel backplane, referred to as a $V_{COM}$ reference plane. The common voltage is supplied by a $V_{COM}$ application circuit coupled to the $V_{COM}$ reference plane. The $V_{COM}$ application circuit includes a $V_{COM}$ amplifier having a closed-loop gain. The $V_{COM}$ application circuit is configurable to quickly adjust the closed-loop gain so as to adjust the settling characteristics of the common voltage $V_{COM}$ output by the $V_{COM}$ application circuit. The $V_{COM}$ application circuit having adjustable closed-loop gain also reduces the amount of power to be dissipated, and therefore the amount of heat generation, in the $V_{COM}$ amplifier.

24 Claims, 7 Drawing Sheets

(51) Int. Cl.
*G09G 3/36* (2006.01)
*G02F 1/1343* (2006.01)
*H04N 13/04* (2006.01)
*G02F 1/1362* (2006.01)
*G02F 1/1337* (2006.01)

(52) U.S. Cl.
CPC ......... G09G3/3696 (2013.01); H04N 13/0454 (2013.01); *G02F 2001/133776* (2013.01); *G09G 3/3607* (2013.01); *G09G 3/3611* (2013.01); *G09G 3/3648* (2013.01); *G09G 2300/08* (2013.01)

(56) References Cited

U.S. PATENT DOCUMENTS

| | | | | |
|---|---|---|---|---|
| 2002/0044223 | A1* | 4/2002 | Miller et al. | 348/571 |
| 2002/0063703 | A1* | 5/2002 | Furuhashi et al. | 345/212 |
| 2004/0104831 | A1* | 6/2004 | May et al. | 341/144 |
| 2005/0140400 | A1* | 6/2005 | Yi et al. | 327/108 |
| 2008/0157825 | A1* | 7/2008 | Hsu et al. | 327/108 |
| 2012/0133634 | A1* | 5/2012 | Her et al. | 345/212 |

OTHER PUBLICATIONS

Non-Final Rejection dated Jun. 16, 2014, in related U.S. Appl. No. 13/405,049, filed Feb. 24, 2012.
Final Rejection dated Jul. 1, 2014, in related U.S. Appl. No. 13/401,591, filed Feb. 21, 2012.
Non-Final Office Action mailed Dec. 4, 2014 in related U.S. Appl. No. 13/401,591, filed Feb. 21, 2012. (15 pgs).
Non-Final Office Action mailed Dec. 23, 2014, in related U.S. Appl. No. 13/405,049, filed Feb. 24, 2012 (10 pgs).
Notice of Allowance dated Dec. 3, 2015, in related U.S. Appl. No. 13/405,049, filed Feb. 24, 2012 (7pgs).
Corrected Notice of Allowance mailed Dec. 22, 2015, in related U.S. Appl. No. 13/405,049, filed Feb. 24, 2012 (10pgs).
Notice of Allowance dated May 7, 2015, in related U.S. Appl. No. 13/401,591, filed Feb. 21, 2012 (11pgs).
Final Office Action dated Jun. 18, 2015, in related U.S. Appl. No. 13/405,049, filed Feb. 24, 2012 (12pgs).
Office Action dated Feb. 29, 2016, in Chinese Patent Application No. 201210048686.2, filed Feb. 27, 2012 (22pgs).

* cited by examiner

VCOM AMPLIFIER WITH FAST-SWITCHING GAIN

RELATED APPLICATIONS

This Patent Application is a continuation in part of U.S. patent application Ser. No. 13/401,591, filed Feb. 21, 2012, and entitled, "VCOM Switching Amplifier." The U.S. patent application Ser. No. 13/401,591 claims priority of U.S. provisional application, Ser. No. 61/446,662, filed Feb. 25, 2011, and entitled "VCOM Switching Amplifier", by at least one common inventor. This application incorporates U.S. patent application Ser. No. 13/401,591 and U.S. provisional application, Ser. No. 61/446,662 in their entireties by reference.

FIELD OF THE INVENTION

This invention relates to displays for electronic devices. More specifically, this invention relates to amplifiers used to provide a common voltage to a display panel.

BACKGROUND OF THE INVENTION

Displays are used on notebook PCs, tablets, mobile devices, televisions, and other electronic devices. Like most electronic devices, displays must be calibrated to accurately display video and graphic images. For example, the common voltage of a display is calibrated for optimum viewing and operation. Without proper calibration, the image on the display can substantially flicker. In some types of displays, such as liquid crystal displays (LCDs), e-ink displays, and electrowetting displays, the pixel material can be damaged if the common voltage is not set correctly.

Some displays are characterized by a common voltage ($V_{COM}$), herein referred to as $V_{COM}$ displays. The $V_{COM}$ voltage is applied to a common voltage reference plane, referred to as the $V_{COM}$ reference plane, of a $V_{COM}$ display panel. The $V_{COM}$ reference plane distributes the $V_{COM}$ voltage to each pixel in the $V_{COM}$ display panel. Application of the $V_{COM}$ voltage allows for adjustment of the absolute voltage applied to the pixel, thereby turning the pixel on and off. Proper calibration of the $V_{COM}$ voltage enables correct operation of each pixel and also maintains a substantially zero volt average across the pixel which prevents the pixel material from becoming damaged, such as causing an image to be burned into the display screen.

The $V_{COM}$ voltage is supplied using one or more appropriate $V_{COM}$ application circuits. Conventional $V_{COM}$ application circuits use a Class AB amplifier to generate the proper $V_{COM}$ voltage level that is provided to the $V_{COM}$ display panel. FIG. 1A illustrates an exemplary conventional $V_{COM}$ application circuit 10. A digital-to-analog converter (DAC) 2 receives as input a digital code representative of the proper $V_{COM}$ voltage level. The DAC 2 outputs a converted analog signal to a first input of an amplifier 4. The amplifier 4 is a Class AB operational amplifier. A second input of the amplifier 4 is a feedback signal. The amplifier 4 is supplied with an analog power supply voltage AVDD. An output of the amplifier 4 is the $V_{COM}$ voltage level that is supplied to the $V_{COM}$ reference plane of a LCD panel 20. The $V_{COM}$ reference plane can be modeled as a distributed RC. In some applications, the $V_{COM}$ voltage level is substantially constant. An alternative configuration of the $V_{COM}$ application circuit 10', as shown in FIG. 1B, can also be implemented to provide a constant $V_{COM}$ voltage level. The $V_{COM}$ application circuit 10' includes a local feedback from the output of the Class AB amplifier 4' to the second input of the Class AB amplifier 4'. The Class AB amplifier 4' can be the same or different than the Class AB amplifier 4 in FIG. 1A. In other applications, the $V_{COM}$ voltage level can be adjusted using the $V_{COM}$ application circuit 10 (FIG. 1A) by providing a feedback signal from the $V_{COM}$ plane 20 to the second input of the Class AB amplifier 4.

In many applications, the $V_{COM}$ amplifier drives a point on one side of the $V_{COM}$ reference plane, and receives a feedback voltage from the other side of the $V_{COM}$ reference plane. Since the $V_{COM}$ reference plane has a relatively large resistance, it is difficult to control the absolute voltage across the entire $V_{COM}$ reference plane, which is necessary to properly operating each pixel. Further, when the pixels are refreshed, turned on, or turned off, there is a resulting change in applied pixel voltage, which capacitively couples current into the $V_{COM}$ reference plane. As such, the localized voltages in the $V_{COM}$ reference plane are changing as different pixels are updated, further effecting the absolute voltage across the entire $V_{COM}$ reference plane. The feedback voltage, such as voltage $V_{COM\_FB}$ in FIG. 1A, is input to the $V_{COM}$ amplifier to adjust the driving $V_{COM}$ voltage. This provides an active feedback for providing an average voltage across the $V_{COM}$ reference plane. However, adjusting the $V_{COM}$ voltage in response to the feedback voltage $V_{COM\_FB}$ results in large current outputs due to the large load capacitance of the $V_{COM}$ reference plane. These large currents cause severe heat rise in the linear $V_{COM}$ amplifier.

SUMMARY OF THE INVENTION

Electronic devices with a $V_{COM}$ display panel are configured to provide a common voltage $V_{COM}$ to a $V_{COM}$ display panel backplane, referred to as a $V_{COM}$ reference plane. The common voltage is supplied by a $V_{COM}$ application circuit coupled to the $V_{COM}$ reference plane. The $V_{COM}$ application circuit includes a $V_{COM}$ amplifier having a closed-loop gain. The $V_{COM}$ application circuit is configurable to quickly adjust the closed-loop gain so as to adjust the settling characteristics of the common voltage $V_{COM}$ output by the $V_{COM}$ application circuit. The $V_{COM}$ application circuit having adjustable closed-loop gain improves the settling time of the common voltage $V_{COM}$. The $V_{COM}$ application circuit having adjustable closed-loop gain also reduces the amount of power to be dissipated, and therefore the amount of heat generation, in the $V_{COM}$ amplifier.

In an aspect, a method of driving a display that uses a common voltage is disclosed. The method includes using a common voltage application circuit to output the common voltage, wherein the application circuit comprises a common voltage amplifier coupled to a power supply. The method also include adjusting a gain of the common voltage amplifier to a first gain during a first portion of a timing period, thereby driving the common voltage according to the first gain, and adjusting the gain of the common voltage amplifier to a second gain during a second portion of the timing period, thereby driving the common voltage according to the second gain, wherein the second gain is less than the first gain. The method also includes refreshing a horizontal line of the display at an end of the timing period using the common voltage driven by the common voltage amplifier according to the second gain. In some embodiments, during the first portion of the timing period, the common voltage is substantially equal to a value of the power supply. In some embodiments, the common voltage amplifier operates in a linear mode when at the second gain. In some embodiments, the common voltage amplifier is a linear amplifier. In other embodiments, the common voltage amplifier is a switching amplifier. In some embodiments, the method also includes receiving a feedback voltage from the display and inputting the feedback voltage to the common voltage amplifier. In some embodiments, the method also includes comparing the feedback voltage to a reference voltage input to the common voltage amplifier to determine a voltage difference, further wherein the first portion begins when the voltage difference exceeds a first threshold value. In some embodiments, the first portion ends and the second portion begins when voltage difference is less than a second threshold value. In other embodiments, the first portion ends and the second portion begins a fixed amount of time after the first portion begins. In other embodiments, the first portion ends and the second portion begins a variable amount of time after the first portion begins, wherein the variable amount of time is determined according to a peak value of the feedback voltage when the first portion begins. In other embodiments, the first portion ends and the second portion begins an amount of time after the first portion begins, wherein the amount of time is determined according to a rise-rate of the feedback voltage. In other embodiments, the timing period includes multiple first portions, each first portion corresponding to a high gain pulse lasting a first fixed amount of time, and multiple second portions, each second portion corresponding to a low gain pulse lasting a second fixed amount of time, thereby forming a series of high gain and low gain pulses, further wherein the series of high gain and low gain pulses continues until the voltage difference is less than a second threshold value.

In another aspect, an electronic device for driving a display that uses a common voltage is disclosed. The electronic device includes a common voltage application circuit, a power supply, and a control circuit. The common voltage application circuit is coupled to the display to output a common voltage to the display, wherein the common voltage application circuit includes a common voltage amplifier configured to receive as input a common voltage feedback from the display. The power supply is coupled to the common voltage amplifier. The control circuit is coupled to the common voltage application circuit, wherein the control circuit is configured to control the common voltage application circuit such that the common voltage amplifier has a first gain during a first portion of a timing period, and the common voltage amplifier has a second gain during a second portion of the timing period, wherein the second gain is less than the first gain. In some embodiments, the common voltage is a linear amplifier. In some embodiments, the common voltage is a switching amplifier. In some embodiments, the power supply includes a positive power supply rail and a negative power supply rail. In some embodiments, the common voltage amplifier is configured to compare the feedback voltage to a reference voltage input to the linear amplifier to determine a voltage difference, further wherein the control circuit is configured to begin the first portion when the voltage difference exceeds a first threshold value. In some embodiments, the control circuit is configured to end the first portion and to begin the second portion when voltage difference is less than a second threshold value. In other embodiments, the control circuit is configured to end the first portion and to begin the second portion a fixed amount of time after the first portion begins. In other embodiments, the control circuit is configured to end the first portion and to begin the second portion a variable amount of time after the first portion begins, wherein the control circuit is configured to determine the variable amount of time according to a peak value of the feedback voltage when the first portion begins. In other embodiments, the control circuit is configured to end the first portion and to begin the second portion an amount of time after the first portion begins, wherein the amount of time is determined according to a rise-rate of the feedback voltage. In other embodiments, the timing period includes multiple first portions, each first portion corresponding to a high gain pulse lasting a first fixed amount of time, and multiple second portions, each second portion corresponding to a low gain pulse lasting a second fixed amount of time, thereby forming a series of high gain and low gain pulses, further wherein the control circuit is configured to continue the series of high gain and low gain pulses until the voltage difference is less than a second threshold value. In some embodiments, the common voltage application circuit also includes a plurality of variable resistors coupled to the common voltage amplifier and to the control circuit, wherein the control circuit is configured to adjust a resistance of each of the plurality of variable resistors thereby setting the first gain and the second gain. In some embodiments, the circuit also includes a switching circuit coupled to the common voltage amplifier, the power supply, and the control circuit, wherein the control circuit is configured to control the switching circuit and the common voltage amplifier such that the output voltage is driven by the power supply during the first portion of the timing period, and the output voltage is driven by the common voltage amplifier during the second portion of the timing period.

In yet another aspect, another method of driving a display that uses a common voltage is disclosed. The method includes using a common voltage application circuit to output the common voltage, wherein the application circuit comprises a common voltage amplifier coupled to a power supply. The method also includes adjusting a gain of the common voltage amplifier to a first gain, thereby driving the common voltage according to the first gain. The method also includes refreshing a first horizontal line of the display at using the common voltage driven by the common voltage amplifier according to the first gain. The method also includes adjusting the gain of the common voltage amplifier to a second gain, thereby driving the common voltage according to the second gain, wherein the second gain is different than the first gain. The method also includes refreshing a second horizontal line of the display using the common voltage driven by the common voltage amplifier according to the second. The method also includes adjusting the gain for each successive horizontal line of the display and refreshing each horizontal line according to the adjusted gain.

In still yet another aspect, another electronic device for driving a display that uses a common voltage is disclosed. The electronic device includes a common voltage application circuit, a power supply, and a control circuit. The common voltage application circuit is coupled to the display to output a common voltage to the display, wherein the common voltage application circuit includes a common voltage amplifier configured to receive as input a common voltage feedback from the display. The power supply is coupled to the common voltage amplifier. The control circuit is coupled to the common voltage application circuit, wherein the control circuit is configured to control the common voltage application circuit such that a gain of the common voltage amplifier is adjusted for each horizontal line of the display.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a $V_{COM}$ application circuit. Those of ordinary skill in the art will realize that the following detailed description of the $V_{COM}$ application circuit is illustrative only and is not intended to be in any way limiting. Other embodiments of the $V_{COM}$ application circuit will readily suggest themselves to such skilled persons having the benefit of this disclosure.

Reference will now be made in detail to implementations of the $V_{COM}$ application circuit as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In some embodiments, the present application is directed to an electronic device with a $V_{COM}$ display panel coupled to a $V_{COM}$ application circuit having a switching amplifier to supply a $V_{COM}$ voltage to the $V_{COM}$ display panel. In some embodiments, the switching amplifier is a Class D amplifier. An output stage of the switching amplifier includes a pair of complimentary transistors that are switched on and off such that the switching amplifier functions effectively as a switching power supply. A power efficiency of the switching amplifier is at least 80%, which is a significant improvement over the conventional $V_{COM}$ application circuit using a Class AB amplifier, such as the conventional $V_{COM}$ application circuit shown in FIG. 1A or 1B. If necessary, an inductor and a capacitance of a $V_{COM}$ backplane of the $V_{COM}$ display panel filters the output signal of the switching amplifier.

Figure 2A:
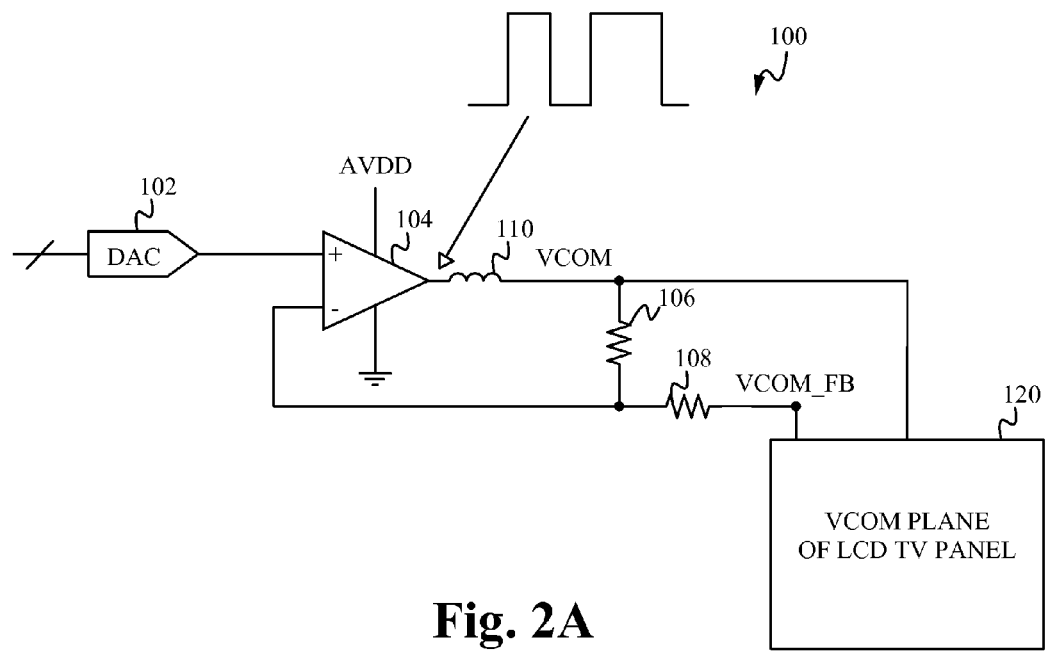
FIG. 2A illustrates a conceptual diagram of a $V_{COM}$ application circuit according to an embodiment.
Figure 3:
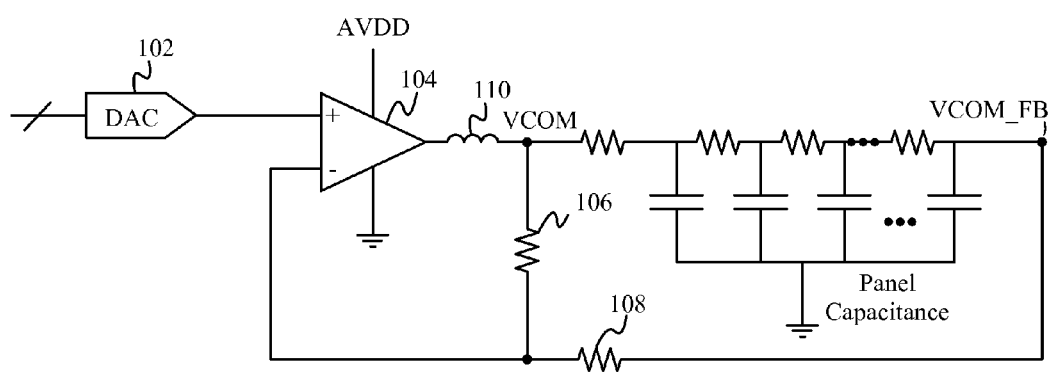
FIG. 3 illustrates the $V_{COM}$ application circuit of FIG. 2 where the $V_{COM}$ reference plane is replaced by its conceptual circuit equivalent.

FIG. 2A illustrates a conceptual diagram of a $V_{COM}$ application circuit 100 according to an embodiment of the present invention. The $V_{COM}$ application circuit 100 includes a DAC 102, a switching operational amplifier 104, an inductor 110, a resistor 106, and a resistor 108. The $V_{COM}$ application circuit 100 is coupled to a backplane of a $V_{COM}$ display panel 120. The backplane is also referred to as a $V_{COM}$ reference plane. The $V_{COM}$ reference plane 120 receives the $V_{COM}$ voltage output from switching amplifier 104. The DAC 102 receives as input a digital code representative of the proper $V_{COM}$ voltage level. The DAC 102 outputs a converted analog signal to a first input of the switching amplifier 104. A second input of the switching amplifier 104 is a feedback signal, referred to as the common voltage feedback $V_{COM\_FB}$. The common voltage feedback $V_{COM\_FB}$ is a feedback signal from the $V_{COM}$ reference plane used to adjust the $V_{COM}$ voltage level to compensate for changes in voltage across the $V_{COM}$ reference plane. The switching amplifier 104 is supplied with an analog power supply voltage AVDD. In some embodiments, the analog supply voltage AVDD has a maximum voltage in the range of about 8V to about 30V. The switching amplifier 104 functions as a switching power supply and therefore outputs a switching waveform, such as that shown in FIG. 2A. The switching waveform output from the switching amplifier 104 is filtered resulting in the $V_{COM}$ voltage level that is supplied to the $V_{COM}$ reference plane of the $V_{COM}$ display panel 120. The $V_{COM}$ reference plane 120 distributes the $V_{COM}$ voltage to each pixel within the $V_{COM}$ display panel. In some applications, the transient current output from the switching amplifier is about 1 amp, where the transient current occurs when a horizontal line of the display is refreshed. In some applications, the load coupled to the $V_{COM}$ application circuit is a DC load that requires a DC current output from the $V_{COM}$ application circuit. In other applications, the load is not a DC load. FIG. 3 illustrates the $V_{COM}$ application circuit 100 of FIG. 2A where the $V_{COM}$ reference plane is replaced by its conceptual circuit equivalence, which is a series of RC sections.

Figure 4:
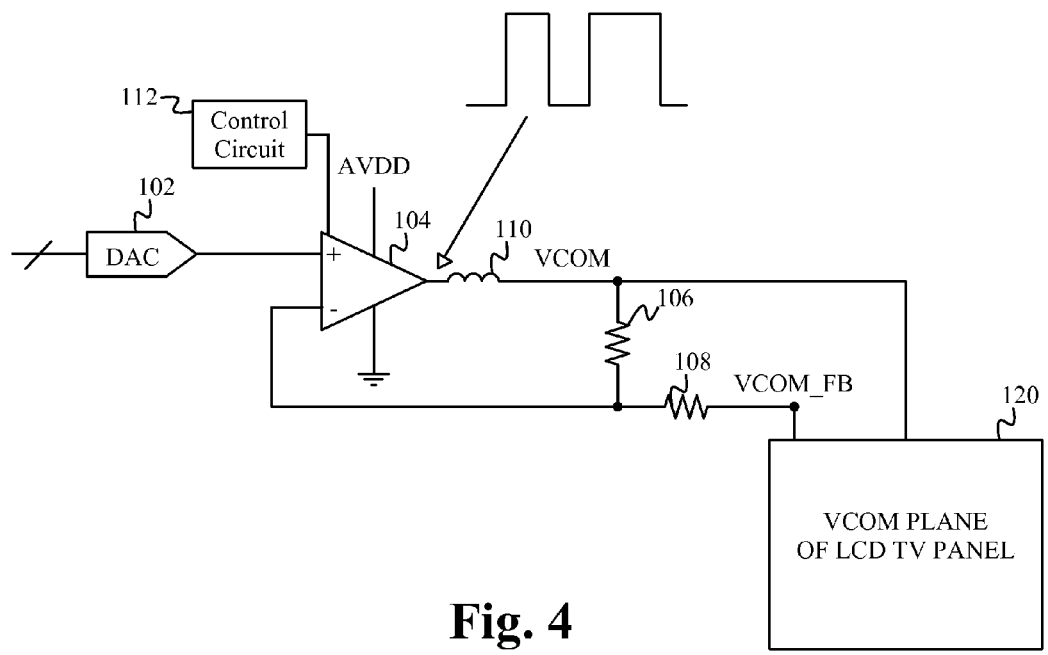
FIG. 4 illustrates the conceptual block diagram of the $V_{COM}$ application circuit of FIG. 2A including a control circuit according to an embodiment.

The switching amplifier 104 modulates the duty cycle of the square wave output to generate the desired $V_{COM}$ voltage level. In some embodiments, a control circuit 112 is coupled to the switching amplifier 104, as shown in FIG. 4. The control circuit 112 is coupled to the switching amplifier 104 so as to modulate a duty cycle of the switching waveform.

The control circuit 112 can also be configured to perform additional control functionality directed to controlling the switching amplifier and/or additional components that may be added to the $V_{COM}$ application circuit. For example, the control circuit 112 can be configured to control a modified $V_{COM}$ application circuit to stabilize with large transient output currents while experiencing reduced minimized power dissipation and heat rise in the switching amplifier. In this exemplary application, a transient assist circuit having a plurality of switches controlled by the control circuit 112 can be added to the $V_{COM}$ application circuit such that the $V_{COM}$ voltage is driven quickly to the positive or negative supply during a transient situation. Embodiments of a $V_{COM}$ application circuit including the transient assist circuit are described in greater detail below.

In another example, the control circuit 112 can be configured to control a modified $V_{COM}$ application circuit to quickly change its closed-loop gain. In an exemplary application, the $V_{COM}$ application circuit is modified to include variable-resistance resistors, the resistance of which is controlled by the control circuit 112. Embodiments of a $V_{COM}$ application circuit having an adjustable closed-loop gain are described in greater detail below.

A filter comprising the inductor 110 and the capacitance of the $V_{COM}$ reference plane 120 filters the switching waveform so as to output the $V_{COM}$ voltage level. There is an inherent parasitic capacitance within the $V_{COM}$ reference plane 120. The filter is designed to consider this parasitic capacitance. If the parasitic capacitance is insufficient to meet the design considerations for the filter, additional capacitance can be added to the $V_{COM}$ application circuit, such as coupling a capacitor to the inductor 110. Using a switching amplifier requires proper selection of the inductor 110 and any additional capacitance to provide necessary circuit stability and quickness of the transient response of the $V_{COM}$ voltage output to the $V_{COM}$ reference plane 120 in the case of a changing output load.

Figure 2B:
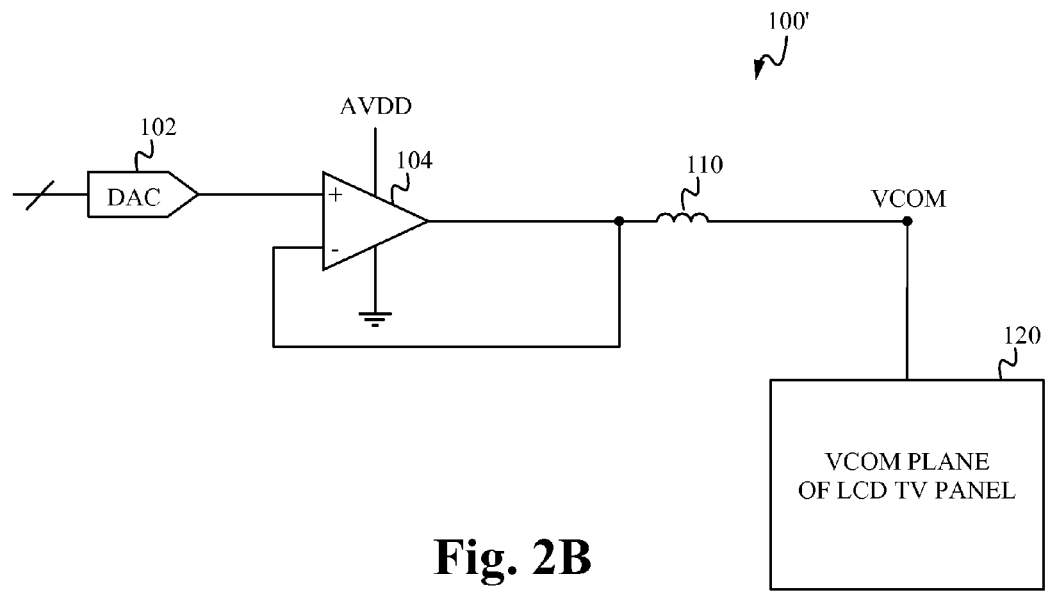
FIG. 2B illustrates a conceptual diagram of an alternative $V_{COM}$ application circuit according to another embodiment.
Figure 2C:
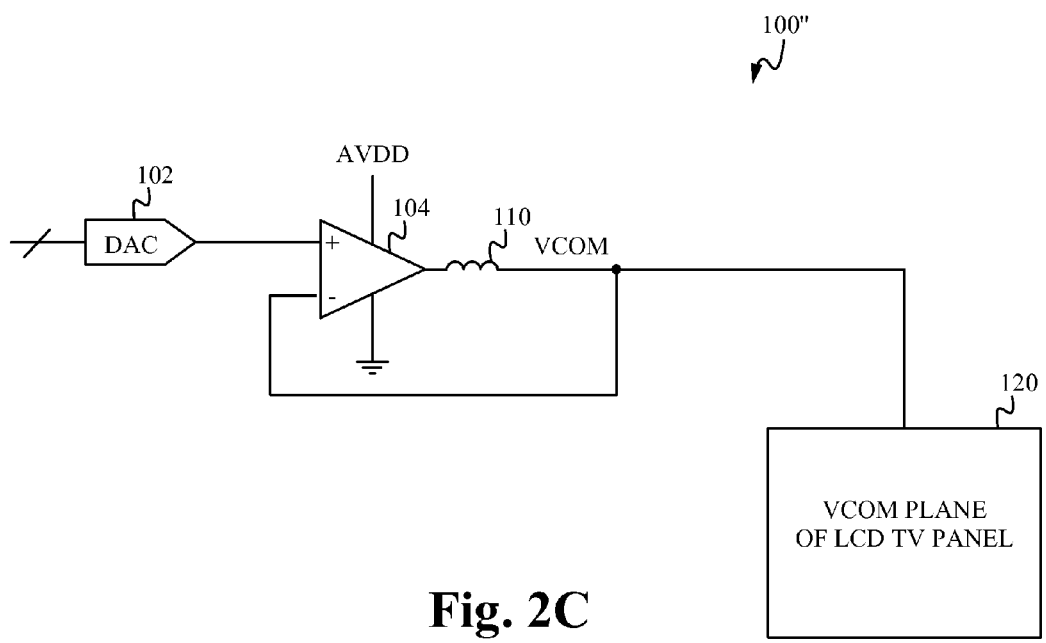
FIG. 2C illustrates a conceptual diagram of an alternative $V_{COM}$ application circuit according to yet another embodiment.

In some embodiments, the $V_{COM}$ voltage level is substantially constant. An alternative configuration of a $V_{COM}$ application circuit 100', as shown in FIG. 2B, can also be implemented to provide a constant $V_{COM}$ voltage level. The $V_{COM}$ application circuit 100' includes a local feedback from the output of the switching amplifier 104 to the second input of the switching amplifier 104. Another alternative configuration of a $V_{COM}$ application circuit to provide a constant $V_{COM}$ voltage level 100" is shown in FIG. 2C and includes a local feedback from the other terminal of the inductor 110 to the second input of the switching amplifier 104.

An advantage of using a switching amplifier in the $V_{COM}$ application circuit is a significant improvement in the power efficiency when compared to conventional $V_{COM}$ application circuits using Class AB amplifiers. Especially when applied to $V_{COM}$ display panels requiring relatively high analog power supply levels, such as 8V to 18V, the improvement in power efficiency also leads to a significant reduction in heat generated by the $V_{COM}$ application circuit.

Embodiments of the $V_{COM}$ application circuit described in relation to FIGS. 2A-4 are directed to $V_{COM}$ application circuits having a switching amplifier. Similar advantages can be achieved using a linear amplifier, such as a Class AB amplifier, coupled to a switched transient assist circuit. The switched transient assist circuit assists the amplifier to stabilize with large transient output currents but with reduced power dissipation and heat rise in the linear amplifier.

In some embodiments, the switched transient assist circuit includes a plurality of switches coupled to the linear amplifier. Control circuitry is coupled to the switches and the linear amplifier. In some embodiments, the linear amplifier is a conventional $V_{COM}$ amplifier. The linear amplifier has a linear output stage including two complimentary transistors configured for sourcing and sinking current.

Figure 5:
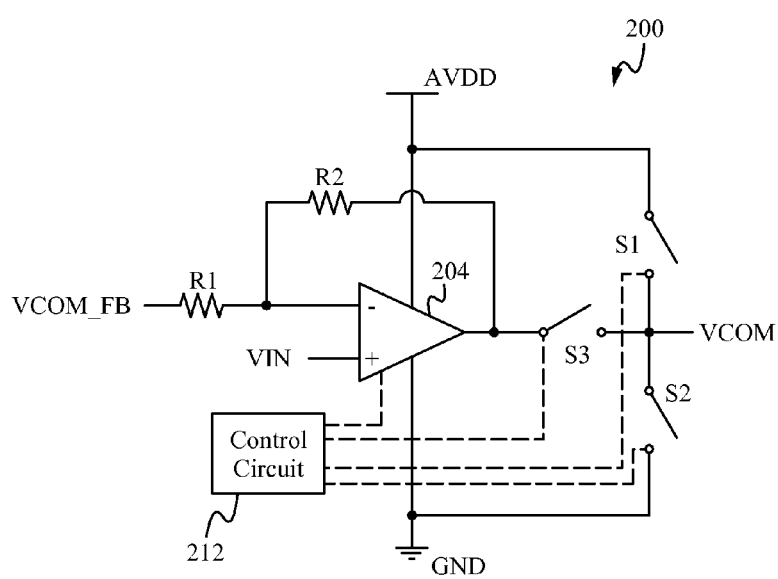
FIG. 5 illustrates a conceptual diagram of a $V_{COM}$ application circuit 200 according to an embodiment.

FIG. 5 illustrates a conceptual diagram of a $V_{COM}$ application circuit 200 according to an embodiment. The $V_{COM}$ application circuit 200 includes a linear amplifier 204 coupled to a switched transient assist circuit. The linear amplifier 204 is provided power by two power supply rails, shown in FIG. 5 as AVDD and GND. Although the linear amplifier 204 is shown and described as being coupled to power supply rails AVDD and ground, it is understood that alternative power supply rails can be used, generally referred to as a positive power supply voltage rail, such as $+V_{AVDD}$, and a negative power supply voltage rail, such as $-V_{AVDD}$. In the exemplary configuration shown in FIG. 5, the switched transient assist circuit includes three switches S1, S2, and S3 coupled to a control circuit 212. The switch S3 is positioned between the output of the linear amplifier 204 and the output of the $V_{COM}$ application circuit 200. The output of the $V_{COM}$ application circuit 200 provides the $V_{COM}$ voltage to the $V_{COM}$ reference plane, such as the $V_{COM}$ reference plane 120 in FIG. 4. The switch S1 is positioned between the positive power supply rail and the output of the $V_{COM}$ application circuit 200. The switch S2 is positioned between the negative power supply rail and the output of the $V_{COM}$ application circuit 200. In some embodiments, the switches S1, S2, and S3 are transistors, which can be part of an integrated device that also includes the linear amplifier 204. In other embodiments, the switches S1, S2, and S3 are discrete elements. The switches S1, S2, and S3 are capable of handling the full supply voltage of the linear amplifier 204. The control circuit 212 controls the operation of each of the switches S1, S2, and S3. In some embodiments, the control circuit 212 also controls the operation of the linear amplifier 204.

The common voltage feedback $V_{COM\_FB}$ is provided as a first input to the input amplifier 204. The common voltage feedback $V_{COM\_FB}$ is a feedback signal from the $V_{COM}$ reference plane. A second input to the linear amplifier, labeled in FIG. 5 as voltage $V_{IN}$, is a stable DC voltage. In some embodiments, the voltage $V_{IN}$ is supplied by a digital-to-analog converter, such as the DAC 102 in FIG. 4. The linear amplifier 204 outputs a driving signal in the opposite direction as the common voltage feedback $V_{COM\_FB}$. The output driving voltage is the $V_{COM}$ voltage input to the $V_{COM}$ reference plane. The common voltage feedback $V_{COM\_FB}$ is used by the linear amplifier 204 to compensate for changing voltages across the $V_{COM}$ reference plane.

When the linear output stage of a linear amplifier has some amount of output current, and the output voltage is between the power supply rails, the voltage drop from the supply rail to the output voltage results in power being dissipated across the amplifier, thereby generating heat.

Figure 1A:
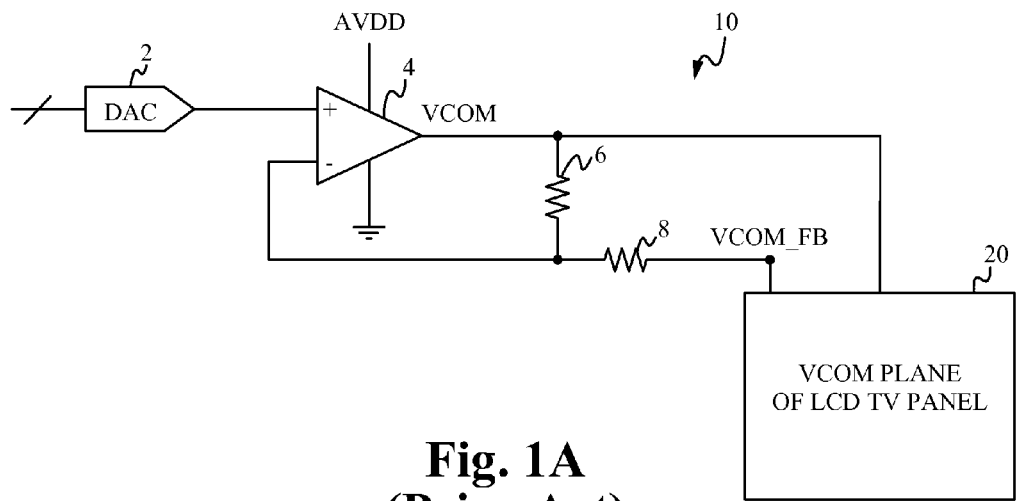
FIG. 1A illustrates a conceptual diagram of an exemplary conventional $V_{COM}$ application circuit.
Figure 1B:
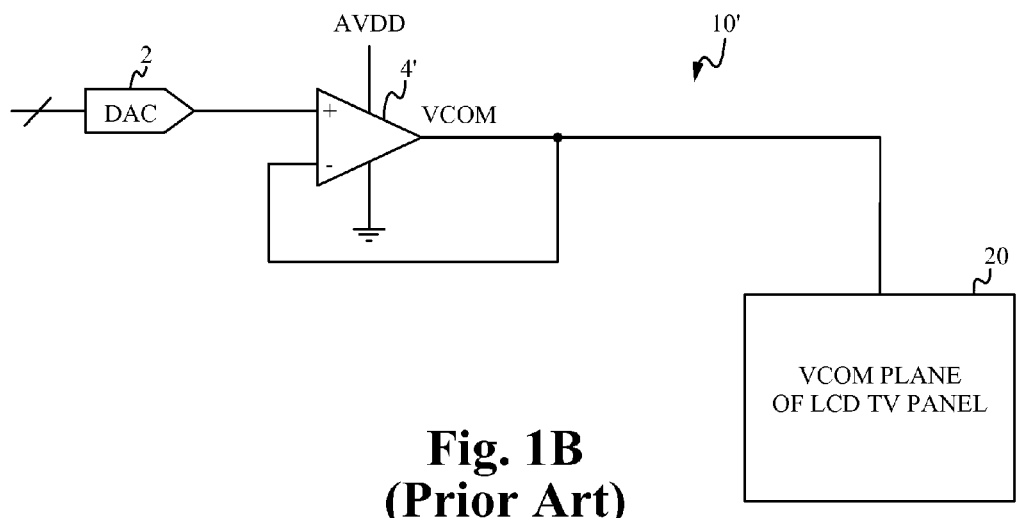
FIG. 1B illustrates a conceptual diagram of an exemplary conventional $V_{COM}$ application circuit according to an alternative configuration.
Figure 6:
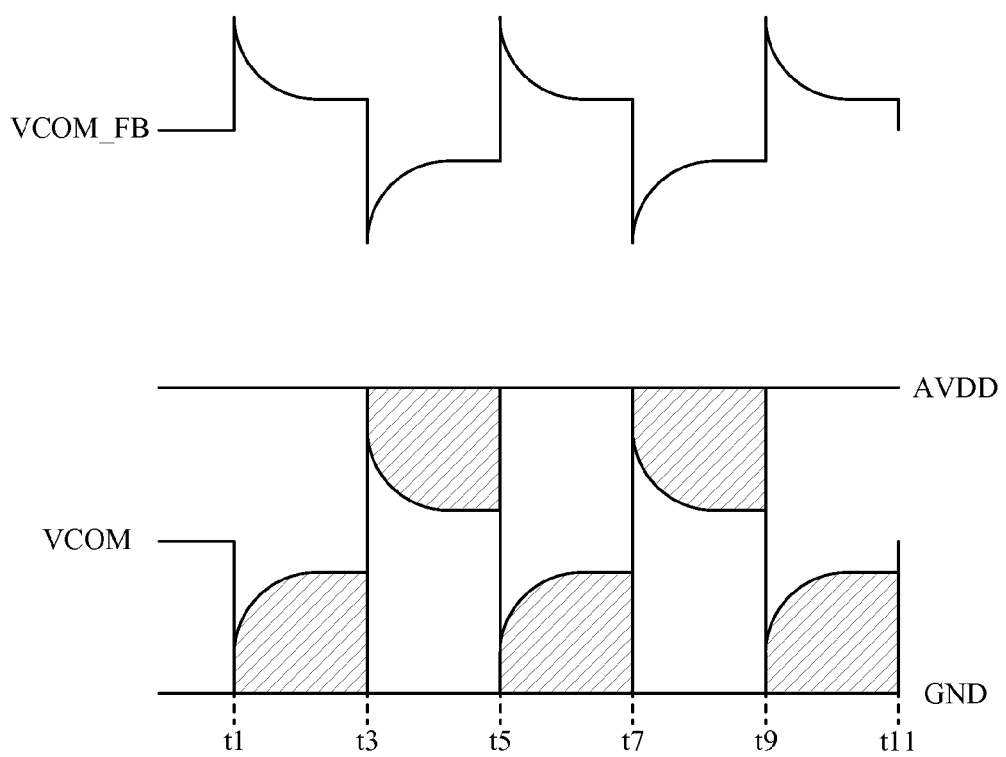
FIG. 6 illustrates exemplary waveforms for the common voltage $V_{COM}$ and the common voltage feedback $V_{COM\_FB}$ corresponding to the conventional $V_{COM}$ application circuit of FIG. 1A.

FIG. 6 illustrates exemplary waveforms for the common voltage $V_{COM}$ and the common voltage feedback $V_{COM\_FB}$ corresponding to the conventional $V_{COM}$ application circuit of FIG. 1A. The amplifier 4 shown in FIG. 1A is a linear amplifier. The common voltage $V_{COM}$ is the output voltage of the linear amplifier. The common voltage feedback $V_{COM\_FB}$ is the feedback voltage from the $V_{COM}$ reference plane, which is input to the linear amplifier to adjust the common voltage $V_{COM}$. As shown in FIG. 6, the waveform of the common voltage $V_{COM}$ is a negative feedback of the waveform of the common voltage feedback $V_{COM\_FB}$ so as to adjust for the continuous changes in voltage across the $V_{COM}$ reference plane. The large swings in the common voltage $V_{COM}$ result in high output RMS current due to the high load capacitance of the $V_{COM}$ reference plane. When the common voltage $V_{COM}$ is between the power supply rails, the voltage difference between the power supply rail and the value of the common voltage $V_{COM}$ results in power being dissipated across the linear amplifier 4, shown as cross-hatched in FIG. 6. The amount of dissipated power is equal to the integral of the voltage difference times the output RMS current.

Figure 7:
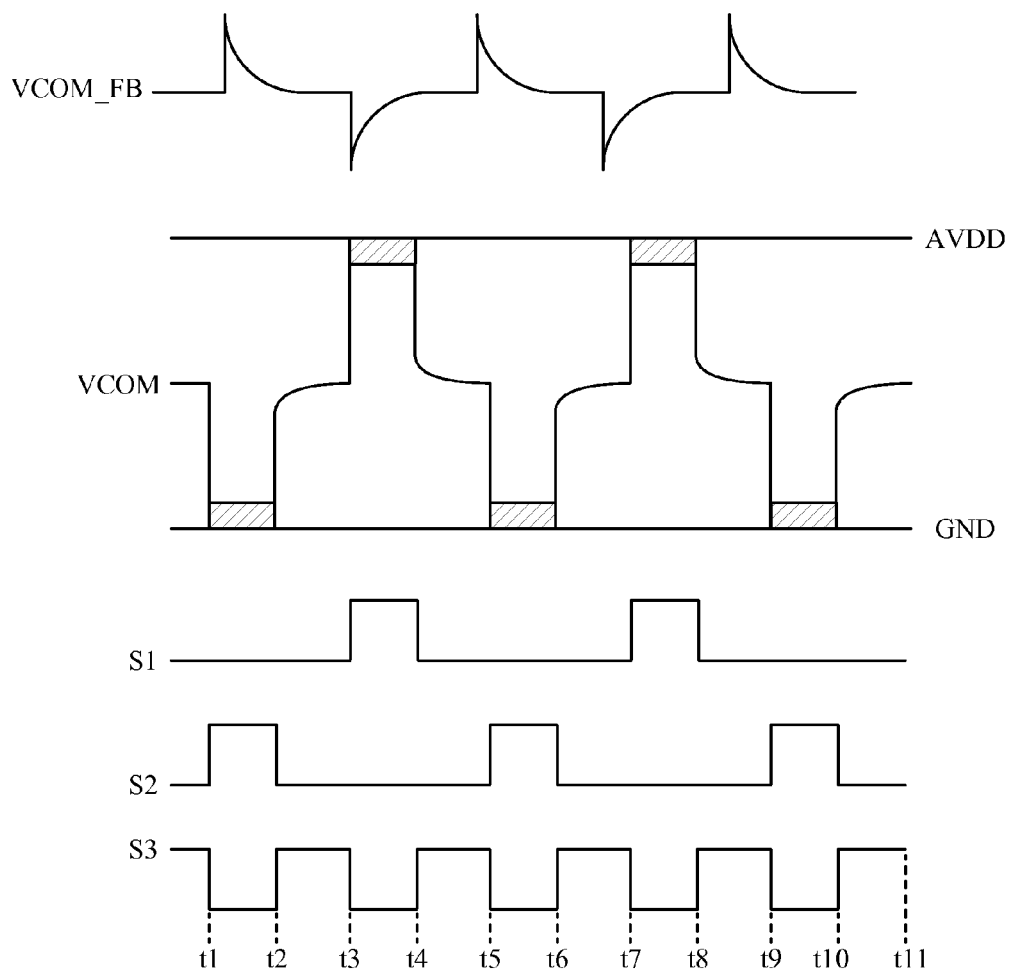
FIG. 7 illustrates waveforms corresponding to an exemplary application of the $V_{COM}$ application circuit, including the transient assist circuit, of FIG. 5.

The $V_{COM}$ application circuit is designed to settle approximately to a designed common voltage $V_{COM}$ at the end of each half-period, such as at times t1, t3, t5, t7, t9, and t11 shown in FIG. 6, which is output to the $V_{COM}$ reference plane. As used herein, a period is a time duration corresponding to one horizontal line synchronization period, such as the time duration from time t1 to time t5. As also used herein, the generalized term "timing period" refers to a time duration during which the common voltage $V_{COM}$ is allowed to settle to its desired value. For example, a timing period as related to FIG. 7 is the time duration from time t1 to time t3, which corresponds to the half-period previously described. The common voltage $V_{COM}$ at the end of each half-period is an intermediate value between the two power supply rails. In this application, the intra-half-period value of the common voltage $V_{COM}$ does not matter, it is only critical that the end of half-period value has settled to the designed value or within an acceptable range about the designed value. As such, the transient assist circuit is configured to drive the common voltage $V_{COM}$ to a value equal to either the positive or negative power supply rail during an intra-half-period, or transient duration. During the transient duration while the value of the common voltage $V_{COM}$ equals either the positive or negative power supply rail, no power is dissipated across the linear amplifier because the difference between the common voltage $V_{COM}$ and the power supply rail is zero. After the transient duration, and before the end of half-period, the transient assist circuit is configured to allow the linear amplifier to drive the common voltage $V_{COM}$, which settles to the designed value by the end of half-period. As shown in FIG. 6, the common voltage $V_{COM}$ at the end of half-period does not settle all the way to the desired level. This is due to the slow settling time of the conventional $V_{COM}$ application circuit.

FIG. 7 illustrates waveforms corresponding to an exemplary application of the $V_{COM}$ application circuit, including the transient assist circuit, of FIG. 5. Times t1, t3, t5, t7, t9, and t11 correspond to end/start of a half-period. At time t1, the switch S2 is closed, and switches S1 and S3 are open. With the switch S3 is open, the linear amplifier 204 is not driving the common voltage $V_{COM}$. Instead, with the switch S2 closed, the negative power supply rail drives the common voltage $V_{COM}$, and the value of the common voltage $V_{COM}$ is equal to or near the value of the negative power supply. Whenever the switch S1 or the switch S2 are closed, the switch S3 is open to prevent the linear amplifier 204 from being shorted to the power supply. The time from time t1 to t2 is a transient duration during which the common voltage $V_{COM}$ is maintained at or near the negative power supply rail. FIG. 7 shows a cross-hatched area extending from time t1 to t2 to indicate that there is some minimal amount of power dissipation across the closed switch S2.

At time t2, the switches S1 and S2 are open, and the switch S3 is closed. During the time from t2 to t3, the linear amplifier 204 drives the common voltage $V_{COM}$, which eventually settles to the designed value at the end of the half-period at time t3.

At time t3, the switch S1 is closed, and the switches S2 and S3 are open. With the switch S3 is open, the linear amplifier 204 is not driving the common voltage $V_{COM}$. Instead, with the switch S1 closed, the positive power supply rail drives the common voltage $V_{COM}$, and the value of the common voltage $V_{COM}$ is equal to or near the value of the positive power supply. The time from time t3 to t4 is a transient duration during which the common voltage $V_{COM}$ is maintained at or near the positive power supply rail. FIG. 7 shows a cross-hatched area extending from time t3 to t4 to indicate that there is some minimal amount of power dissipation across the closed switch S1.

At time t4, the switches S1 and S2 are open, and the switch S3 is closed. During the time from t4 to t5, the linear amplifier 204 drives the common voltage $V_{COM}$, which eventually settles to or near the designed value at the end of the half-period at time t5.

The sequence repeats for time t5 to time t9.

Comparing the cross-hatched areas in FIG. 7 to the cross-hatched areas in FIG. 6 shows a reduction in the amount of power generated, and therefore heat dissipated, using the $V_{COM}$ application circuit having the transient assist circuit.

Further, since the common voltage $V_{COM}$ output is hard switched to the power supply rails, the settling time is accelerated as compared to the conventional $V_{COM}$ application circuit. In some embodiments, the common voltage $V_{COM}$ settles to a value that is within 25 mV of the designed voltage. In other embodiments, the common voltage $V_{COM}$ settles to a value that is within 10 mV of the designed voltage. In contrast, the common voltage $V_{COM}$ of the conventional $V_{COM}$ application circuit of FIG. 1A settles to a value within about 100 mV of the designed voltage.

The amount of power dissipated and heat generated during the transient duration is due, in part, to the resistance of the closed switches S1 and S2. The larger the switch size, the lower the resistance. However, larger switches are more expensive in terms of area and driving power consumption. As such, the size of the switch is a design consideration that takes into account cost as well as minimum heat specifications, both of the $V_{COM}$ application circuit and the overall system within which the $V_{COM}$ application circuit is implemented.

The control circuit 212 is configured to implement an algorithm for triggering the transient duration on and off. There are multiple control schemes possible for the switching of the transient assist circuit. One such technique is a simple comparator scheme. When the absolute value of the difference between the common voltage feedback $V_{COM\_FB}$ and the voltage $V_{IN}$ exceeds a first threshold, the transient duration is activated, such as at times t1, t3, t5, t7, or t9 in FIG. 7. When the absolute voltage difference returns to within a second threshold, which may or may not be the same as the first threshold, the transient duration is deactivated, such as at times t2, t4, t6, t8, or t10 in FIG. 7.

Another technique is a simple fixed on-time scheme. When the absolute value of the difference between the common voltage feedback $V_{COM\_FB}$ and the voltage $V_{IN}$ exceeds a threshold, the transient duration is activated. The transient duration is active for a fixed amount of time, programmed by digital register or external components for example. After the fixed amount of time, the transient duration is deactivated. In some embodiments, the transient duration can be re-activated if the absolute value of the difference between the common voltage feedback $V_{COM\_FB}$ and the voltage $V_{IN}$ still exceeds the programmed threshold. In other embodiments, the transient duration can not be re-activated within the same half-period. In a variation, the duration of the on-time can be determined. As an example, the on-time can be calculated using the rise rate of the common voltage feedback $V_{COM\_FB}$. In some embodiments, there is a one-to-one relationship between the rise rate and the duration of the on-time. In other embodiments, different relationships between the rise rate and the duration of the on-time are used. As another example, a look-up table can be used to determine the duration of the on-time according to the rise rate. The on-time can be determined on a periodic basis. For example, the on-time can be calculated for each period described in relation to FIG. 7.

Another technique is a variable on-time scheme. When the absolute value of the difference between the common voltage feedback $V_{COM\_FB}$ and the voltage $V_{IN}$ exceeds a threshold, the transient duration is activated. The transient duration is active for a variable amount of time, determined by the peak value of the common voltage feedback $V_{COM\_FB}$, which is detected within the linear amplifier. There may be a scaling factor to this time, which may be programmed in digital registers or by external components.

Another technique is a fixed pulse train scheme. When the absolute value of the difference between the common voltage feedback $V_{COM\_FB}$ and the voltage $V_{IN}$ exceeds a threshold, the transient duration is activated. The switches S1 or S2 are turned on and off with a fixed on time and fixed off time, creating a series of pulses. The pulses continue until the absolute value of the difference between the common voltage feedback $V_{COM\_FB}$ and the voltage $V_{IN}$ is within the programmed threshold.

Another technique is a digital on-time control scheme. The transient duration is active for a period of time which is programmed in the digital domain by a display timing controller or another digital source, according to the video data that is received. The video data is provided from either the system central processor or graphics processor, or from a standard video source. The video data is received by the display's timing controller and converted into the signals that drive the display itself. The controller predicts what transient assist will be necessary and programs the linear amplifier accordingly. The controller predicts what timing is necessary depending on the anticipated disturbance to the common voltage $V_{COM}$ by the incoming video data. The severity of a disturbance in the $V_{COM}$ reference plane depends on the video signal received and the method of driving the pixels, of which there are many.

It is understood that alternative techniques can be used for implementing the transient duration.

The configuration of the transient assist circuit shown in FIG. 5 is an example configuration for implementing the transient assist concept. In general, the linear amplifier, the transient assist circuit, and the control circuit are configured to drive the common voltage $V_{COM}$ to either the positive or negative power supply rail during a transient duration and to subsequently drive the common voltage $V_{COM}$ using the linear amplifier such that the common voltage $V_{COM}$ settles to a desired value by the end of a timing period. The control circuit is configured to implement an algorithm for triggering the transient duration on and off. In essence, this techniques is a combination of a switch mode technique, which corresponds to the transient duration, and linear mode technique, which corresponds to when the linear amplifier is driving the common voltage $V_{COM}$. This combination technique combines the switch mode technique and the linear mode technique in the time domain where the two techniques alternate back and forth.

In an alternative configuration to that shown in FIG. 5, the switch S3 can be eliminated, and instead the linear amplifier is enabled and disabled according to the same timing considerations as switching the switch S3 closed and open, respectively. It is understood that alternative configurations can be used to implement the desired transient duration.

The transient assist concept is applied above in the context of a $V_{COM}$ application circuit. It is understood that the transient assist concept can be applied to alternative applications. In general, the transient assist concept can be used in those applications that accommodate moving an output voltage to or near the value of the power supply for a portion of a timing period before settling to a desired output voltage level by the end of the timing period, such as the half-period shown in FIG. 7.

Embodiments of the $V_{COM}$ application circuit described in relation to FIGS. 5 and 7 are directed to $V_{COM}$ application circuits having a transient assist circuit for driving the output voltage to the power supply rail during a transient duration. Similar results can be achieved by changing the gain of the $V_{COM}$ amplifier during select portions of the timing period. In some embodiments, a closed-loop gain of the $V_{COM}$ amplifier is alternated between high gain and low gain. Control circuitry is coupled to the $V_{COM}$ amplifier. Driving the $V_{COM}$ amplifier at high gain simulates driving the output voltage at the power supply rails. Driving the $V_{COM}$ amplifier at low gain enables linear mode of operation to settle the output voltage to a desired level before the end of the timing period. The closed-loop gain can be adjusted to infinite, or practically, equal to the open-loop gain of the amplifier. The closed-loop gain of the $V_{COM}$ amplifier determines in part the amount of heat rise in the $V_{COM}$ amplifier. The higher the closed-loop gain, the larger the output voltage and current transients tend to be. A benefit of changing the closed-loop gain from high gain to low gain during the timing period is to improve the settling time of the $V_{COM}$ reference plane during large transients. Another benefit is to reduce the amount of heat dissipation in the $V_{COM}$ amplifier. As the output approaches the power supply rails the amount of voltage across the output devices is reduced.

Figure 8:
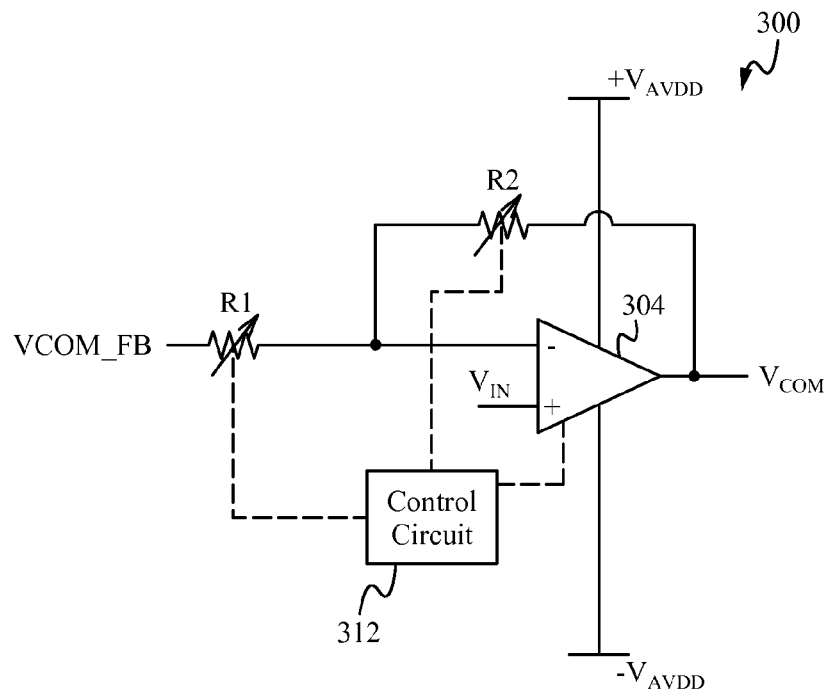
FIG. 8 illustrates a conceptual diagram of a $V_{COM}$ application circuit according to an embodiment.

FIG. 8 illustrates a conceptual diagram of a $V_{COM}$ application circuit 300 according to an embodiment. The $V_{COM}$ application circuit 300 includes a $V_{COM}$ amplifier 304. In some embodiments, the $V_{COM}$ amplifier is a linear amplifier, such as a Class AB amplifier. In other embodiments, the $V_{COM}$ amplifier is a switching amplifier, such as a Class D amplifier. The $V_{COM}$ amplifier 304 is provided power by two power supply rails, generally shown in FIG. 7 as $+V_{AVDD}$ and $-V_{AVDD}$. In the exemplary configuration shown in FIG. 8, the $V_{COM}$ application circuit 300 also includes variable resistors R1 and R2. The variable resistors R1 and R2 conceptually represents any conventional method of changing the gain of the $V_{COM}$ amplifier 304. As shown in FIG. 8, variable resistors are used to change the closed-loop gain of the $V_{COM}$ amplifier 304. Examples of alternative methods for changing the gain of the $V_{COM}$ amplifier include, but are not limited to, having the variable resistors configured within the $V_{COM}$ amplifier or using internal switches within the $V_{COM}$ amplifier. In another example, if the $V_{COM}$ amplifier is a transconductance amplifier, then the current can be adjusted to change the gain of the amplifier. In general, any type of amplifier and any method of changing the gain of the amplifier can be used that enables changing the amplifier gain to a high gain for generating a large output variation with little heat dissipation during a transient duration, and that enables changing the amplifier gain to a low gain for operating the amplifier in a linear mode that outputs a desired common voltage $V_{COM}$ value at the end of a time period.

The $V_{COM}$ amplifier 304 and the variable resistors R1 and R2 are coupled to a control circuit 312. The control circuit 312 controls the operation of the $V_{COM}$ amplifier 304 and each of the variable resistors R1 and R2 to selectively change a closed-loop gain of the $V_{COM}$ amplifier 304. In general, the control circuit 312 controls those elements for setting and changing the gain of the $V_{COM}$ amplifier.

The common voltage feedback $V_{COM\_FB}$ is provided as a first input to the $V_{COM}$ amplifier 304. The common voltage feedback $V_{COM\_FB}$ is a feedback signal from the $V_{COM}$ reference plane. A second input to the $V_{COM}$ amplifier, labeled in FIG. 8 as voltage $V_{IN}$, is a stable DC voltage. In some embodiments, the voltage $V_{IN}$ is supplied by a digital-to-analog converter, such as the DAC 102 in FIG. 4. The $V_{COM}$ amplifier 304 outputs a driving signal in the opposite direction as the common voltage feedback $V_{COM\_FB}$. The output driving voltage is the $V_{COM}$ voltage input to the $V_{COM}$ reference plane. The common voltage feedback $V_{COM\_FB}$ is used by the $V_{COM}$ amplifier 304 to compensate for changing voltages across the $V_{COM}$ reference plane.

Figure 9:
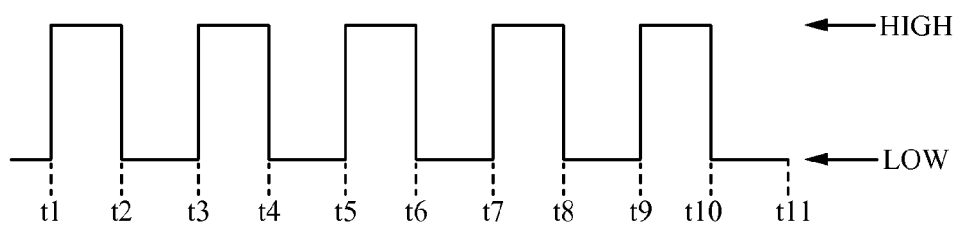
FIG. 9 illustrates an exemplary closed-loop gain waveform used by the $V_{COM}$ application circuit of FIG. 8.

FIG. 9 illustrates an exemplary closed-loop gain waveform used by the $V_{COM}$ application circuit 300 of FIG. 8. Times t1-t11 are comparable to the same time frames shown in FIG. 7. Application of the closed-loop gain waveform shown in FIG. 9 results in similar waveforms for the common voltage feedback $V_{COM\_FB}$ and the common voltage $V_{COM}$ shown in FIG. 7. In operation, the $V_{COM}$ amplifier 304 operates in a linear mode according to a normal gain. As used herein, this normal gain is referred to the low gain. Times t1, t3, t5, t7, t9, and t11 correspond to end/start of a half-period. At time t1, the variable resistors R1 and R2 are configured such that the $V_{COM}$ amplifier 304 operates at a high gain. At high gain, the $V_{COM}$ amplifier 304 no longer operates in the linear mode, but instead the output value of the $V_{COM}$ amplifier is driven to the power supply rails. At high gain, any disturbance on the common voltage feedback $V_{COM\_FB}$ results in a large variation of the output voltage, the common voltage $V_{COM}$. With the gain sufficiently high, this output value reaches the same, or close, to that of the power supply rails. As applied to the common voltage feedback $V_{COM\_FB}$ and the common voltage $V_{COM}$ waveforms of FIG. 7, at high gain, the value of the common voltage $V_{COM}$ is equal to or near the value of the positive or negative power supply rail. The time from time t1 to t2 is a transient duration during which the common voltage $V_{COM}$ is maintained at the negative power supply rail.

At time t2, the variable resistors R1 and R2 are configured such that the $V_{COM}$ amplifier 304 operates at its normal gain, or low gain. During the time from t2 to t3, the $V_{COM}$ amplifier 304 operates in the linear mode and drives the common voltage $V_{COM}$ to eventually settle to or near the designed value at the end of the half-period at time t3.

At time t3, the variable resistors R1 and R2 are configured such that the $V_{COM}$ amplifier 304 again operates at high gain. As applied to the waveforms of FIG. 7, at high gain, the value of the common voltage $V_{COM}$ is equal to or near the value of the positive power supply at time t3. The time from time t3 to t4 is a transient duration during which the common voltage $V_{COM}$ is maintained at the positive power supply rail.

At time t4, the variable resistors R1 and R2 are configured such that the $V_{COM}$ amplifier 304 again operates at low gain. During the time from t4 to t5, the $V_{COM}$ amplifier 304 operates in the linear mode and drives the common voltage $V_{COM}$ to eventually settle to or near the designed value at the end of the half-period at time t5.

The sequence repeats for time t5 to time t9.

The control circuit 312 is configured to implement an algorithm for changing between high gain and low gain, thereby triggering the transient duration on and off, respectively. There are multiple control schemes to control changing of the amplifier gain. In some embodiments, the control schemes are similar to those used to control switching of the transient assist circuit. One such technique is a simple comparator scheme. When the absolute value of the difference between the common voltage feedback $V_{COM\_FB}$ and the voltage $V_{IN}$ exceeds a first threshold, the $V_{COM}$ amplifier closed-loop gain is adjusted by a fixed amount, such as at times t1, t3, t5, t7, or t9 in FIG. 9. The resulting closed-loop gain is the high gain. When the absolute voltage difference returns to within a second threshold, which may or may not be the same as the first threshold, the closed-loop gain is decreased to the original value, such as at times t2, t4, t6, t8, or t10 in FIG. 9. The resulting closed-loop gain is the low gain. The amount of closed-loop gain adjustment may depend on a peak detection circuit to detect the amplitude of the common voltage feedback $V_{COM\_FB}$.

Another technique is a simple fixed on-time scheme. When the absolute value of the difference between the common voltage feedback $V_{COM\_FB}$ and the voltage $V_{IN}$ exceeds a threshold, the $V_{COM}$ amplifier closed-loop gain is adjusted by a fixed amount to achieve the high gain. The high gain is maintained, and the transient duration is active, for a fixed amount of time, programmed by digital register or external components for example. After the fixed amount of time, the transient duration is deactivated by decreasing the closed-loop gain to the original value to achieve the low gain. In some embodiments, the transient duration can be re-activated if the absolute value of the difference between the common voltage feedback $V_{COM\_FB}$ and the voltage $V_{IN}$ still exceeds the programmed threshold. In other embodiments, the transient duration can not be re-activated within the same half-period. In a variation, the duration for which the high gain is maintained can be determined. As an example, the duration can be calculated using the rise rate of the common voltage feedback $V_{COM\_FB}$. In some embodiments, there is a one-to-one relationship between the rise rate and the duration. In other embodiments, different relationships between the rise rate and the duration are used. As another example, a look-up table can be used to determine the duration according to the rise rate. The duration can be determined on a periodic basis. For example, the on-time can be calculated for each period described in relation to FIG. 9.

Another technique is a variable on-time scheme. When the absolute value of the difference between the common voltage feedback $V_{COM\_FB}$ and the voltage $V_{IN}$ exceeds a threshold, the closed-loop gain is changed to the high gain, thereby activating the transient duration. The transient duration is active for a variable amount of time, determined by the peak value of the common voltage feedback $V_{COM\_FB}$, which is detected within the $V_{COM}$ amplifier. There may be a scaling factor to this time, which may be programmed in digital registers or by external components.

Another technique is a fixed pulse train scheme. When the absolute value of the difference between the common voltage feedback $V_{COM\_FB}$ and the voltage $V_{IN}$ exceeds a threshold, the transient duration is activated by changing to the high gain. The closed-loop gain is changed back and forth from high gain to low gain, each for a fixed amount of time, creating a series of pulses. The pulses continue until the absolute value of the difference between the common voltage feedback $V_{COM\_FB}$ and the voltage V is within the programmed threshold.

Another technique is a digital on-time control scheme. The closed-loop gain is adjusted to high gain for a period of time which is programmed in the digital domain by a display timing controller or another digital source, according to the video data that is received. The controller predicts the amount of gain and timing for the gain adjustment is necessary, and programs the $V_{COM}$ amplifier accordingly.

It is understood that alternative techniques can be used for implementing a control scheme to control changing of the amplifier gain.

In an alternative application, the $V_{COM}$ application circuit of FIG. 8 can be used to apply a different gain to each horizontal line of the $V_{COM}$ reference plane. The $V_{COM}$ application circuit of FIG. 8 is described above as having the same low gain value for each period. Alternatively, the low gain value can be varied on a timing period by timing period basis. In an exemplary application, a $V_{COM}$ application circuit is physically positioned at the top end of a display panel. The low gain value for a first horizontal line in the $V_{COM}$ reference plane is set to a first value, where the first horizontal line is the topmost line in the $V_{COM}$ reference plane. For each successive horizontal line descending toward the bottom of the $V_{COM}$ reference plane, the low gain value is increased. For example, the low gain value for the second horizontal line is greater than the low gain value for the first horizontal line, and so on, such that the last horizontal line at the bottom of the $V_{COM}$ reference plane is applied the highest value of low gain. The low gain values applied to each horizontal line can be calculated values based on measurable characteristics of the display, or the low gain values can be predetermined such as from a look-up table. Alternative methods can be used to determine the low gain values for each horizontal line.

Adjusting the line by line gain as described above can also be implemented without driving the common voltage $V_{COM}$ to the power supply rails during a first portion of the timing period. In this case, there is not a high gain and a low gain for each timing period. Instead, the "normal gain", or low gain, is maintained for the duration of the timing period, but the low gain value is adjusted on a line by line basis.

The variable gain concept is applied above in the context of a $V_{COM}$ application circuit. It is understood that the variable gain concept can be applied to alternative applications. In general, the variable gain concept can be used in those applications that accommodate moving an output voltage to or near the value of the power supply for a portion of a timing period before settling to or near a desired output voltage level by the end of the timing period.

The present application has been described in terms of specific embodiments incorporating details to facilitate the understanding of the principles of construction and operation of the $V_{COM}$ application circuit. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed:

1. A method of driving a display that uses a common voltage, the method comprising:
    alternately adjusting a common voltage amplifier output between a first gain during a first portion of a first half period, thereby driving the common voltage amplifier output to or near the value of a first power supply rail voltage and a second gain during a second portion of the first half period,
    wherein the common voltage amplifier output settles to a predetermined common voltage at an end of the first half period, driving the common voltage amplifier output during a first portion of a second half period to or near the value of a second power supply rail voltage according to the first gain so as to reduce a voltage drop from the respective power supply rail to the output voltage across an output stage of the common voltage amplifier, and driving the common voltage amplifier according the second gain during a second portion of the second half period, wherein the common voltage amplifier output settles to a predetermined common voltage at an end of the second half period, wherein the second gain is less than the first gain.

2. The method of claim 1 further comprising providing a stable DC voltage input to the common voltage amplifier.

3. The method of claim 1, further comprising, operating the common voltage amplifier in a linear mode during a second portion of the first half period.

4. The method of claim 1, wherein the common voltage amplifier comprises a switching amplifier.

5. The method of claim 1 further comprising receiving a second voltage from the display and inputting the second voltage to the common voltage amplifier.

6. The method of claim 5 further comprising comparing a feedback voltage to a reference voltage input to the common voltage amplifier to determine a voltage difference, further wherein the first portion begins when the voltage difference exceeds a first threshold value.

7. The method of claim 6 wherein the first portion ends and the second portion begins when voltage difference is less than a second threshold value.

8. The method of claim 6 wherein the first portion ends and the second portion begins a fixed amount of time after the first portion begins.

9. The method of claim 6 wherein the first portion ends and the second portion begins a variable amount of time after the first portion begins, wherein the variable amount of time is determined according to a peak value of the feedback voltage when the first portion begins.

10. The method of claim 6 wherein the first portion ends and the second portion begins an amount of time after the first portion begins, wherein the amount of time is determined according to a rise-rate of the feedback voltage.

11. The method of claim 6 wherein the timing period includes multiple first portions, each first portion corresponding to a high gain pulse lasting a first fixed amount of time, and multiple second portions, each second portion corresponding to a low gain pulse lasting a second fixed amount of time, thereby forming a series of high gain and low gain pulses, further wherein the series of high gain and low gain pulses continues until the voltage difference is less than a second threshold value.

12. An electronic device for driving a display that uses a common voltage, the electronic device comprising:
    a common voltage application circuit coupled to the display to output a common voltage to the display, wherein the common voltage application circuit comprises a common voltage amplifier configured to receive as input a second voltage as feedback from the display;
    a power supply coupled to the common voltage amplifier, the common mode voltage is alternately driven to or near the value of a first rail voltage of the power supply during a first half period and to or near the value of a second rail voltage of the power supply during a second half period to reduce a voltage drop from the respective power supply rail to the output voltage across an output stage of the common voltage amplifier, wherein the common voltage settles to a predetermined value at an end of the first and second half period; and
    a control circuit coupled to the common voltage application circuit, wherein the control circuit is configured to control the common voltage application circuit such that the common voltage amplifier has a first gain during the first half period and a second gain during a second half period, wherein the second gain is less than the first gain.

13. The circuit of claim 12 wherein the common voltage amplifier comprises a linear amplifier.

14. The circuit of claim 12 wherein the common voltage amplifier comprises a switching amplifier.

15. The circuit of claim 12 wherein the power supply comprises a positive power supply rail and a negative power supply rail.

16. The circuit of claim 12 wherein the common voltage amplifier is configured to compare the feedback voltage to a reference voltage input to the linear amplifier to determine a voltage difference, further wherein the control circuit is configured to begin the first portion when the voltage difference exceeds a first threshold value.

17. The circuit of claim 16 wherein the control circuit is configured to end the first half period and to begin the second half period when voltage difference is less than a second threshold value.

18. The circuit of claim 16 wherein the control circuit is configured to end the first half period and to begin the second half period a fixed amount of time after the first portion begins.

19. The circuit of claim 16 wherein the control circuit is configured to end the first half period and to begin the second half period a variable amount of time after the first half period begins, wherein the control circuit is configured to determine the variable amount of time according to a peak value of the feedback voltage when the first half period begins.

20. The circuit of claim 16 wherein the control circuit is configured to end the first half period and to begin the second half period an amount of time after the first half period begins, wherein the amount of time is determined according to a rise-rate of the feedback voltage.

21. The circuit of claim 16 wherein the timing period includes multiple first portions, each first portion corresponding to a high gain pulse lasting a first fixed amount of time, and multiple second portions, each second portion corresponding to a low gain pulse lasting a second fixed amount of time, thereby forming a series of high gain and low gain pulses, further wherein the control circuit is configured to continue the series of high gain and low gain pulses until the voltage difference is less than a second threshold value.

22. The circuit of claim 12 wherein the common voltage application circuit further comprises a plurality of variable resistors coupled to the common voltage amplifier and to the control circuit, wherein the control circuit is configured to adjust a resistance of each of the plurality of variable resistors thereby setting the first gain and the second gain.

23. The circuit of claim 12 further comprising a switching circuit coupled to the common voltage amplifier, the power supply, and the control circuit, wherein the control circuit is configured to control the switching circuit and the common voltage amplifier such that the output voltage is driven by the power supply during the first half period, and the output voltage is driven by the common voltage amplifier during the second half period.

24. A method of driving a display that uses a common voltage, the method comprising:
 using a common voltage application circuit to output the common voltage, wherein the application circuit comprises a common voltage amplifier coupled to a first and a second power supply rail voltage;
 adjusting a gain of the common voltage amplifier to a first gain, thereby driving the common voltage to or near the first power supply rail voltage during a first half period;
 refreshing a first horizontal line of the display at using the common voltage driven by the common voltage amplifier according to the first gain;
 adjusting the gain of the common voltage amplifier to a second gain, thereby driving the common voltage to or near the second power supply rail voltage according to the second gain during a second half period, wherein the second gain being different from the first gain, wherein the common voltage settles to a predetermined value at an end of the first and second half period;
 refreshing a second horizontal line of the display using the common voltage driven by the common voltage amplifier according to the second gain; and
 adjusting the gain for each successive horizontal line of the display and refreshing each horizontal line according to the adjusted gain.

\* \* \* \* \*